United States Patent
Guo

(10) Patent No.: US 11,442,525 B2
(45) Date of Patent: Sep. 13, 2022

(54) POWER MANAGEMENT

(71) Applicant: MICRON TECHNOLOGY, INC., Boise, ID (US)

(72) Inventor: Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 311 days.

(21) Appl. No.: 16/548,910

(22) Filed: Aug. 23, 2019

(65) Prior Publication Data

US 2021/0055772 A1     Feb. 25, 2021

(51) Int. Cl.
| G06F 1/00 | (2006.01) |
| G06F 1/324 | (2019.01) |
| G06F 1/3225 | (2019.01) |
| G06F 1/3234 | (2019.01) |
| G11C 5/14 | (2006.01) |
| G11C 8/18 | (2006.01) |
| G06F 1/3203 | (2019.01) |

(52) U.S. Cl.
CPC ............ G06F 1/324 (2013.01); G06F 1/3225 (2013.01); G06F 1/3275 (2013.01); G11C 5/14 (2013.01); G11C 8/18 (2013.01); G06F 1/3203 (2013.01)

(58) Field of Classification Search
CPC ...... G06F 1/324; G06F 1/3225; G06F 1/3275; G06F 1/28; G06F 1/305; G11C 5/14; G11C 8/18; G11C 16/30

USPC .......................................................... 713/323
See application file for complete search history.

(56) References Cited

U.S. PATENT DOCUMENTS

| 9,293,176 | B2 | 3/2016 | Grunzke |
| 9,417,685 | B2 | 8/2016 | Ha et al. |
| 9,947,401 | B1* | 4/2018 | Navon ............... G06F 11/0727 |
| 2014/0237167 | A1 | 8/2014 | Yurzola et al. |
| 2015/0205540 | A1* | 7/2015 | Yoo ....................... G06F 3/0688 |
| | | | 711/103 |
| 2015/0235677 | A1 | 8/2015 | Grunzke |
| 2019/0179392 | A1 | 6/2019 | Patel |
| 2021/0055772 | A1* | 2/2021 | Guo ....................... G06F 1/324 |

OTHER PUBLICATIONS

International Search Report and Written Opinion of the International Searching Authority for Application No. PCT/US2020/045710 dated Nov. 13, 2020(15 pages).

\* cited by examiner

*Primary Examiner* — Volvick Derose
(74) *Attorney, Agent, or Firm* — Dicke, Billig & Czaja, PLLC

(57) ABSTRACT

Methods of operating a die might include determining an expected peak current magnitude of the die for a period of time, and outputting the expected peak current magnitude from the die prior to completion of the period of time. Apparatus might be configured to perform similar methods.

30 Claims, 13 Drawing Sheets

POWER MANAGEMENT

TECHNICAL FIELD

The present disclosure relates generally to memory and, in particular, in one or more embodiments, the present disclosure relates to methods and apparatus utilizing predictive peak current monitoring in power management.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Power consumption is often an important consideration in the design and usage of memory devices. Problems may arise when multiple memory devices are operated concurrently. Such problems could include exceeding power consumption specifications and/or availability.

BRIEF DESCRIPTION OF THE DRAWINGS

FIG. 14 is a block diagram of registers that might be used with embodiments.

FIG. 15 is a block diagram of other registers that might be used with embodiments.

DETAILED DESCRIPTION

Figure 1:
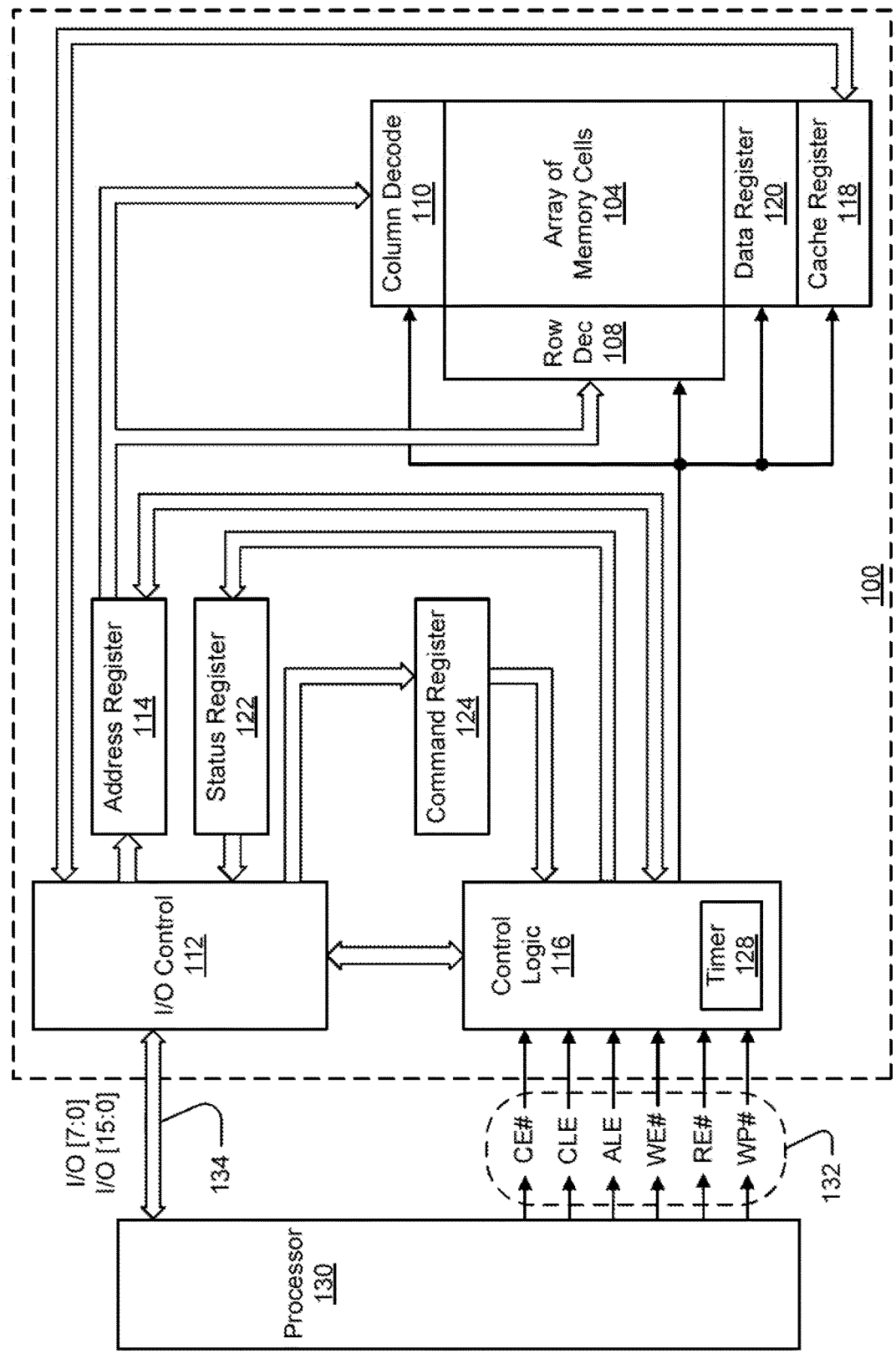
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

NAND memory is widely used in managed NAND (MNAND) and Solid-State Drive (SSD) systems. Common examples of MNAND might include embedded MultiMediaCard (eMMC) as might be common in SSD systems, embedded USB (eUSB) as might be common in industrial applications, and Universal Flash Storage as might be common in digital cameras, mobile phones and other consumer electronic devices. The capacitive loading of three-dimensional NAND is generally large and may continue to grow as process scaling continues. Various access lines, data lines and voltage nodes may need to be charged or discharged very quickly during sense (e.g., read or verify), program, and erase operations so that memory array access operations can meet the performance specifications that are often required to meet data throughput targets as might be dictated by customer requirements or industry standards, for example. For sequential read or programming, multi-plane operations are often used to increase the system throughput. As a result, typical NAND memory can have peak current usage close to 200 mA, which might be four to five times the average current amplitude. With an average market requirement of 800-1000 mA of total current usage budget for an MNAND system, it can become challenging to operate more than four NAND memory concurrently.

A variety of techniques have been utilized to manage power consumption of memory systems containing multiple memory devices, many of which rely on a memory controller to stagger the activity of the memory devices seeking to avoid performing high power portions of access operations concurrently in more than one memory device. Various embodiments described herein facilitate power management among multiple dies (e.g., memories) without external controller intervention by having dies look ahead to their expected peak current magnitudes, and making a decision on how to proceed responsive to a value indicative of sum of these expected peak current magnitudes.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 may be configured to perform methods of various embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a data buffer (e.g., page buffer) of the memory device 100. A data buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

The control logic 116 may further be in communication with a timer 128. The timer 128 may be configured to toggle the logic level of an output signal upon reaching an elapsed time, e.g., a programmable interval timer. Such programmable interval timers are well known. For example, the timer 128 may normally provide an output signal having a logic low level, and may briefly toggle the output signal, e.g., for one clock cycle, to a logic high level upon reaching some particular elapsed time. Subsequent to toggling the output signal, the timer 128 may return the output signal to its normal logic level. The particular elapsed time may be responsive to a received control signal. Alternatively, the timer 128 may represent a counter configured to decrement a count value representative of an elapsed time, e.g., in response to cycles of a clock signal. Such operation of counters is well known.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2:
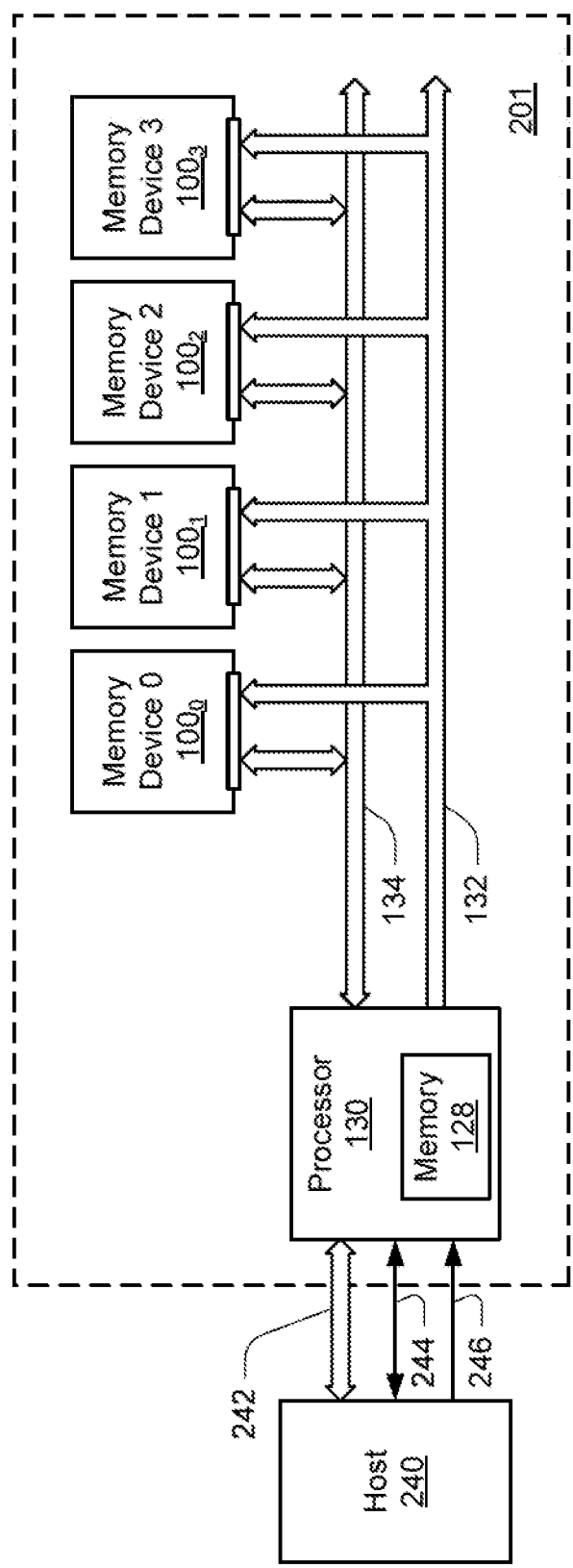
FIG. 2 is a simplified block diagram of a memory module in communication with a host as part of an electronic system, according to another embodiment.

A given processor 130 might be in communication with one or more memory devices 100, e.g., dies. FIG. 2 is a simplified block diagram of an apparatus in the form of a memory module 201 in communication with a host 240 as part of an electronic system, according to another embodiment. Memory devices 100 and processor 130 might be as described with reference to FIG. 1. Although memory module (e.g., package) 201 is depicted with four memory devices 100 (e.g., dies), memory module could have one or more memory devices 100.

Because processor 130 (e.g., a memory controller) is between the host 240 and the memory devices 100, communication between the host 240 and the processor 130 might involve different communication links than those used between the processor 130 and the memory devices 100. For example, the memory module 201 might be an Embedded MultiMediaCard (eMMC) of a solid state drive (SSD). In accordance with existing standards, communication with an eMMC might include a data link 242 for transfer of data (e.g., an 8-bit link), a command link 244 for transfer of commands and device initialization, and a clock link 246 providing a clock signal for synchronizing the transfers on the data link 242 and command link 244. The processor 130 might handle many activities autonomously, such as error correction, management of defective blocks, wear leveling and address translation.

Figure 3:
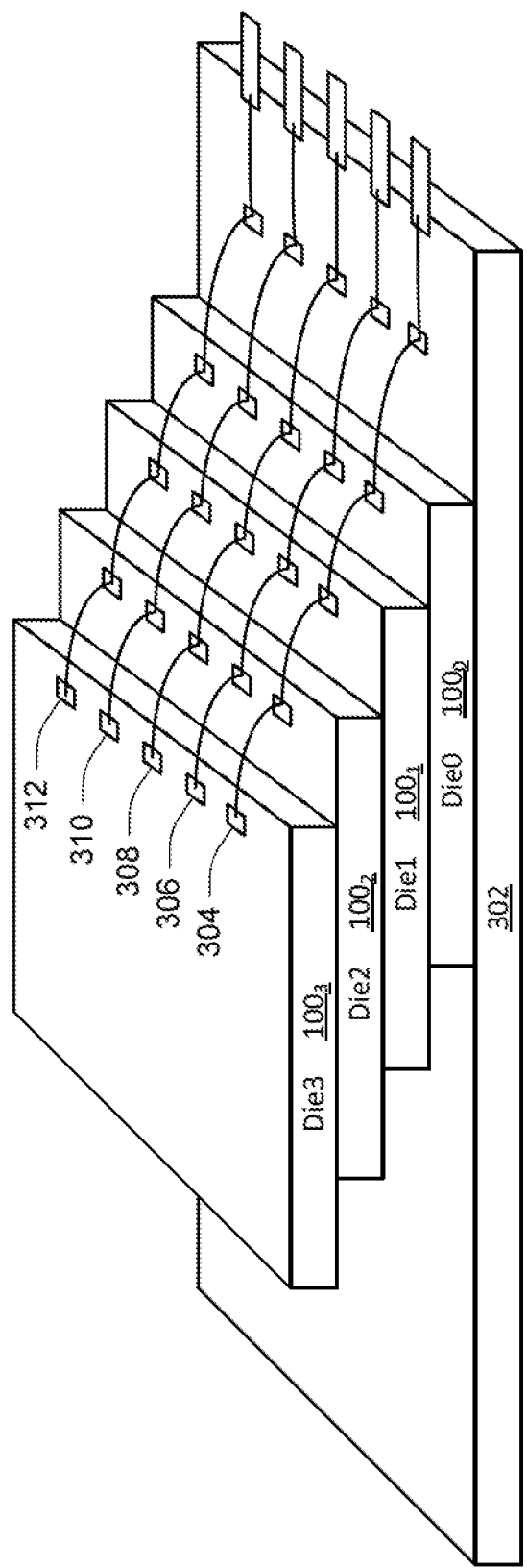
FIG. 3 is a perspective view of a representation of a multi-die package according to an embodiment.

FIG. 3 is a perspective view of a representation of a multi-die package 302 according to an embodiment. Multi-die package 302 is depicted to include four dies 100 (i.e., 100$_0$-100$_3$ corresponding to Die0-Die3), although multi-die packages could have fewer or more such dies. Each of the dies 100, as well as the package 302, might include a node 304 (e.g., a pad) for providing a ready/busy control signal RB #. The ready/busy control signal might be used to indicate to a host device or to the dies 100 in the multi-die package 302 whether one or more of the dies 100 are busy performing an operation. As such, the nodes 304 might be commonly connected. Each of the dies 100, as well as the package 302, might include a node 306 for providing input/output (I/O) signals. Note that each node 306 might represent more than one physical node, e.g., one pad for each signal of the I/O bus 134 of FIG. 1 for each of the dies 100 and the multi-die package 302. The nodes 306 might be commonly connected. Each of the dies 100, as well as the package 302, might include a node 308 for providing control signals. Note that each node 308 might represent more than one physical node, e.g., one pad for each signal of the control link 132 of FIG. 1 for each of the dies 100 and the multi-package 302. The nodes 308 might be commonly connected. Each of the dies 100, as well as the package 302, might include a node 310 for sharing a peak current magnitude indicator signal HC #. Use of the peak current magnitude indicator signal HC # will be described with reference to subsequent figures. The peak current magnitude indicator signal HC # might be shared between the dies 100, and may be shared with an external device, e.g., a processor 130 or a host 240, to monitor expected peak current magnitudes. The nodes 310 might be commonly connected. Each of the dies 100 might include a node 312 for providing a clock signal ICLK. Use of the clock signal will be described with reference to subsequent figures. The clock signal might be received from an external device, e.g., a processor 130 or a host 240, and might be shared between the dies 100. Alternatively, the clock signal ICLK might be generated by one of the dies 100. The nodes 312 might be commonly connected among the dies 100.

Figure 4:
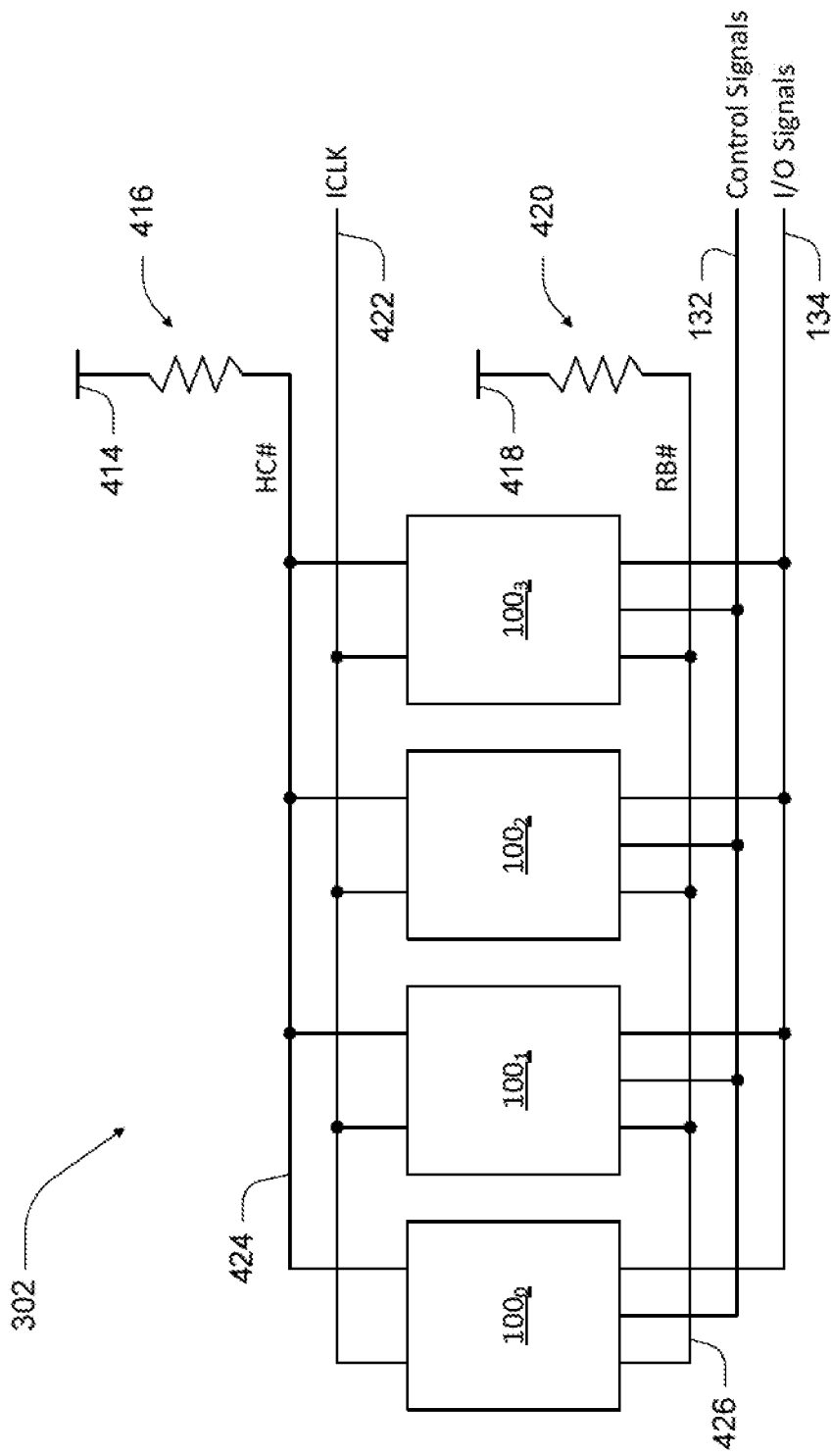
FIG. 4 is a schematic representation of a multi-die package according to an embodiment.

FIG. 4 is a schematic representation of the multi-die package 302 including four dies 100 (e.g., 100$_0$-100$_3$) according to an embodiment. The clock signal ICLK is commonly shared between the dies 100 through a clock signal line 422. The peak current magnitude indicator signal HC # is commonly shared between the dies 100 through a signal line 424. The peak current magnitude indicator signal HC # might be normally pulled to a particular state (e.g., pulled high), such as by connecting the signal line 424 to a voltage supply node 414, coupled to receive a supply voltage such as Vcc, through a resistor 416, sometimes collectively referred to as a weak pull-up resistor, or simply a pull-up resistor.

The ready/busy control signal RB # is commonly shared between the dies 100 through a control signal line 426. The ready/busy control signal RB # might be normally pulled to a particular state (e.g., pulled high), such as by connecting the ready/busy control signal line 426 to a voltage supply node 418 through a resistor 420. Each of the dies 100 is further commonly connected to a control link 132 and to an I/O bus 134.

Various embodiments will be discussed with reference to the multi-die package 302 of FIG. 4. It will be apparent that such embodiments could utilize fewer or more dies 100 than those depicted in FIG. 4. In general, access operations of the dies 100 might be divided into a number of phases. These phases might be determined such that the access operation could be paused upon completion of one phase and before initiation of the next phase without unnecessarily hindering completion of the access operation other than causing a delay. For example, it may be undesirable to pause the access operation if pausing at that point would require discharge of some node, and that node would require restoring that charge to the node before initiating the next phase. Similarly, it may be undesirable to pause the access operation if pausing at that point would risk loss or corruption of data values.

Each phase might correspond to a respective duration, which may be predefined (e.g., a phase that has the same or similar timing characteristics each time it is performed) or variable (e.g., a phase whose timing characteristics vary based on detection of some analog characteristic). Each phase might further correspond to a respective expected peak current magnitude. Table 1 provides one example of magnitudes of expected peak currents that might be assigned to various phases of an access operation.

TABLE 1

| Level | Encoded Value | Expected Peak current magnitude |
|---|---|---|
| 0 | 000 | <25 mA |
| 1 | 001 | <50 mA |
| 2 | 010 | <75 mA |
| 3 | 011 | <100 mA |
| 4 | 100 | <125 mA |
| 5 | 101 | <150 mA |
| 6 | 110 | <175 mA |
| 7 | 111 | <200 mA |

While the example of Table 1 depicts eight different levels of expected peak current magnitude, other number of levels of expected peak current magnitude might be used with embodiments. For example, using a four-digit encoded value (e.g., a digital representation) sixteen levels of expected peak current magnitude might be defined, which might provide a more granular control of total current usage of a multi-die system. In addition, while the example of Table 1 depicts levels of expected peak current magnitude that differ from adjacent levels of expected peak current magnitude by a constant difference, the current difference between adjacent levels need not be constant. The expected peak current magnitude might not represent actual peak current magnitude. For example, as will be discussed in more detail with reference to FIG. 5, the expected peak current magnitude might correspond a level of peak current magnitude that is deemed to represent the current usage of the phase.

Various embodiments facilitate power management in a multi-die package by having the dies of the package look ahead in time to determine whether they are expected to initiate a next phase within a particular length of time (e.g., a look-ahead time), and whether initiating that next phase might be expected to change the peak current magnitude of that die. Each die can broadcast their expected peak current magnitude to remaining dies, and each die can make informed decisions based on a sum of the expected peak current magnitudes. For example, a die may decide to pause an operation after completion of its present phase of an operation, or initiate the next phase in a different operating mode, e.g., a lower peak-current operating mode, if performance of the next phase under normal operating conditions would be deemed to exceed a total current usage budget of the package.

With regard to broadcasting expected peak current magnitudes, a die might determine whether it is expected to transition to a next phase of its operation, or initiate a new operation, within a particular length of time. If such a transition is expected, it might determine its expected peak current magnitude within the particular length of time to be the larger of the expected peak current magnitude of its present phase (which may include being idle) and the expected peak current magnitude of its next phase (which may include a first phase of an initial or next operation). If no such transition is expected, it might determine its expected peak current magnitude within the particular length of time to be the expected peak current magnitude of its present phase (which may include being idle).

The die may further determine whether the magnitude of its expected peak current within the particular length of time, in combination with the expected peak current magnitudes of remaining dies, would be deemed to exceed a total current usage budget. If so, the die might decide that its operation should be paused after completion of the present phase, and might broadcast to remaining dies that its expected peak current magnitude within the particular length of time has the expected peak current magnitude of its present phase. If the total current usage budget would be deemed to not be exceeded, the die might broadcast to remaining dies that its expected peak current magnitude within the particular length of time has the magnitude corresponding to the next phase of its operation. Note that a die that is idle, e.g., not performing any operation, might be deemed to have a base magnitude of expected peak current magnitude, which might be the lowest magnitude of the defined plurality of expected peak current magnitudes. Further note that while an idle die might be deemed to have an expected peak current magnitude corresponding to the lowest magnitude of the plurality of expected peak current magnitudes, the lowest magnitude of the plurality of expected peak current magnitudes might be sufficient to further correspond to certain phases of operations actively being performed by a die.

Alternatively, if the next phase of its operation can be operated in a low-peak-current operating mode, and such operation is enabled, the die might recalculate the total of the expected peak current magnitudes using an expected peak current magnitude of the low-peak-current operating mode of the next phase. As one example, low-peak-current operating modes might include slowing down charge pumps or other voltage generation devices to reduce the rate of current usage. This may increase the duration of the next phase, e.g., nodes may not reach intended voltage levels as quickly. If the total current usage budget is deemed to be exceeded using the expected peak current magnitude of the next phase under normal operating conditions, but not deemed to be exceeded using the expected peak current magnitude of the low-peak-current operating mode of the next phase, the die might broadcast to remaining dies that its expected peak current magnitude within the particular length of time has the magnitude corresponding to the low-peak-current operating mode of the next phase of its operation (or the magnitude corresponding to its present phase, whichever is greater), and proceed toward performing the next phase in the low-peak-current operating mode.

Figure 5:
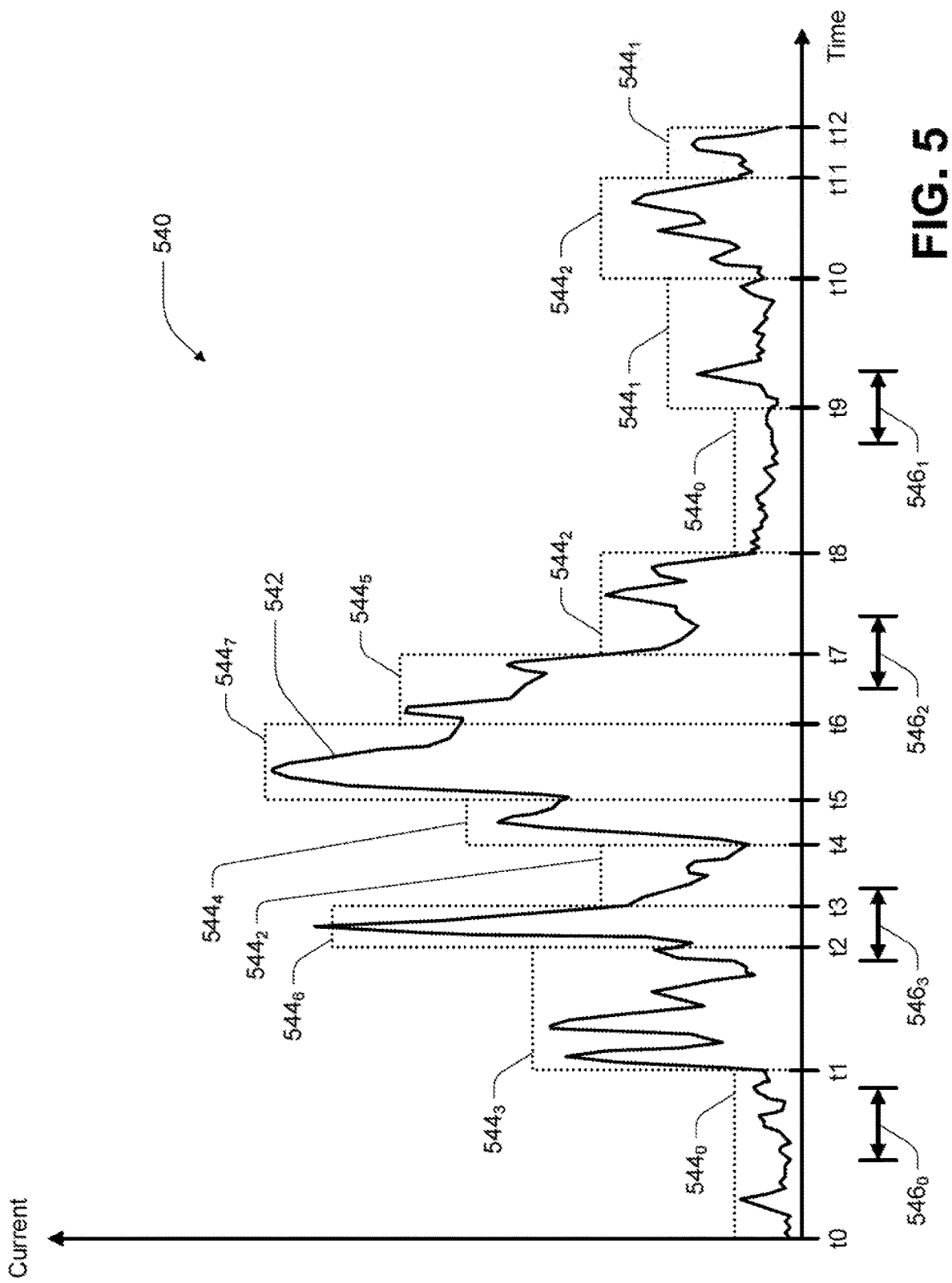
FIG. 5 is a timing diagram depicting current usage of an operation of an apparatus having multiple phases of varying magnitudes of expected peak current magnitude for use in describing embodiments.

FIG. 5 is one example of a timing diagram depicting current usage of an operation 540 of an apparatus having multiple phases of varying magnitudes 544 of expected peak current magnitude for use in describing embodiments. For example, trace 542 might represent expected current usage of an access operation 540 on a memory array over time. While trace 542 depicts a wide range of values of expected current usage over time with periods of higher current usage and periods of lower current usage, as might be expected in the various types of operations a memory might perform, trace 542 may not depict actual current usage of any particular operation, but is merely provided to assist in describing methods of various embodiments. In practice, expected peak current magnitude of an operation as a function of time might be determined experimentally, empirically or through simulation.

The phases of the access operation 540, e.g., from time t0 to time t1, from time t1 to time t2, from time t2 to time t3, etc., each have a corresponding magnitude 544 of expected peak current magnitude, e.g., a corresponding one of the magnitudes $544_0$-$544_7$. For this example, the magnitudes $544_0$-$544_7$ might correspond to the levels of expected peak current magnitude of Table 1 in a one-to-one relationship. Accordingly, the magnitude $544_0$ might represent an expected peak current magnitude of less than 25 mA, the magnitude $544_1$ might represent an expected peak current magnitude of less than 50 mA, the magnitude $544_2$ might represent an expected peak current magnitude of less than 75 mA, the magnitude $544_3$ might represent an expected peak current magnitude of less than 100 mA, the magnitude $544_4$ might represent an expected peak current magnitude of less than 125 mA, the magnitude $544_5$ might represent an expected peak current magnitude of less than 150 mA, the magnitude $544_6$ might represent an expected peak current magnitude of less than 175 mA, and the magnitude $544_7$ might represent an expected peak current magnitude of less than 200 mA, for example.

In general, a phase might be assigned a particular magnitude of expected peak current of a number of defined magnitudes of expected peak current in response to a maximum level of current usage expected at any point during the duration of that phase. While a phase might be assigned to the smallest of the number of defined magnitudes of expected peak current in which its expected current usage can be bounded, embodiments are not so constrained. For example, the brief excursion of trace 542 above the magnitude $544_6$ of the phase from time t2 to time t3 might be deemed to be de minimis and ignored for purposes of assigning its magnitude.

Figure 6:
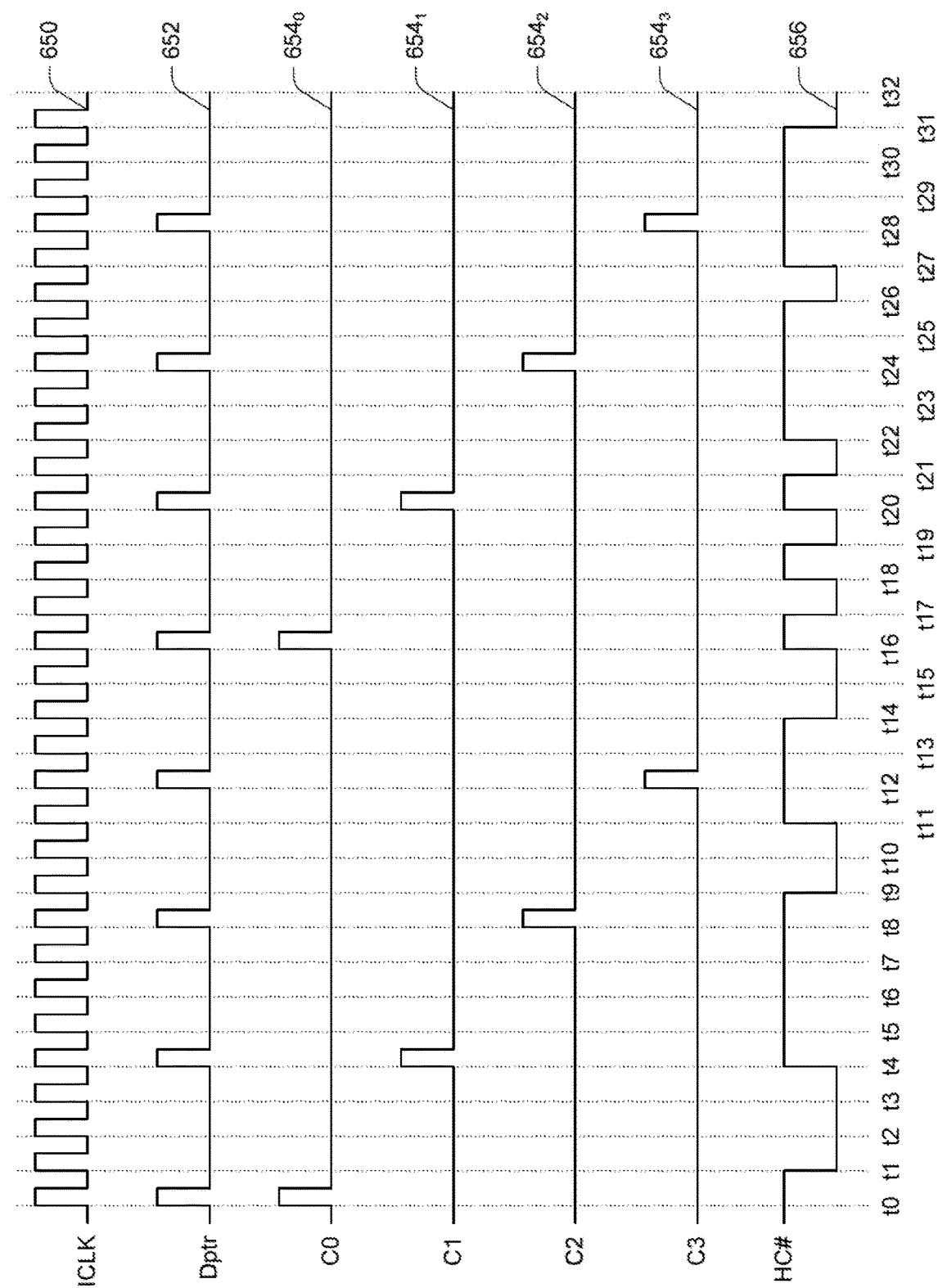
FIG. 6 is a timing diagram depicting clock and control signals in accordance with an embodiment.

FIG. 6 is one example of a timing diagram depicting clock and control signals in accordance with an embodiment. FIG. 6 assumes a multi-die package such as depicted in FIG. 4 having four dies 100. Various embodiments provide each die (e.g., in sequence) an opportunity to evaluate its expected peak current magnitude within some time period (e.g., future time period), to determine whether to continue or pause its operation, and to broadcast its expected peak current magnitude during that time period to remaining die. In FIG. 6, trace 650 might represent the clock signal ICLK.

For one embodiment, trace 652 might represent a die pointer Dptr generated by dividing the clock signal ICLK. For example, the control signal of trace 652 might exhibit a pulse every X cycles of the clock signal ICLK, where X=4 in this example. In turn, each of the dies $100_0$-$100_3$ might count pulses of die pointer Dptr in a repeating fashion, e.g., counting from 0 through 3, and then repeating the sequence from a count of 0 in response to a subsequent pulse of the die pointer Dptr. Each of the dies $100_0$-$100_3$ might be assigned a respective count value. In this manner, die $100_0$ might respond to each count of 0, die $100_1$ might respond to each count of 1, die $100_2$ might respond to each count of 2, and die $100_3$ might respond to each count of 3. The value of X might be selected in response to a desired number of cycles of the clock signal ICLK for use in broadcasting expected peak current magnitude to other dies, as will be described in more detail infra. Using the example of Table 1, representing the various magnitudes of expected peak current magnitude using three digits of data, three clock cycles might be used for the broadcast of that digital representation. A value of X might then be equal to or greater than the number of clock cycles used for the broadcast.

Alternatively, each die 100 might be responsive to a separate control signal. For example, traces $654_0$-$654_3$ might represent counter signals C0-C3, respectively. The control signals of traces $654_0$-$654_3$ might exhibit a pulse every D*X cycles of the clock signal ICLK, where D=4 and X=4 in this example. The value of D might equal a number of die sharing the clock signal ICLK, and a number of counters might equal D. The value of X might be selected in response to a desired number of cycles of the clock signal ICLK for use in broadcasting expected peak current magnitude to other dies, as will be described in more detail infra, and the pulses of traces $654_0$-$654_3$ might be staggered from one another by X cycles of the clock signal ICLK. In this embodiment, each die $100_0$-$100_3$ might be responsive to a respective counter signal C0-C3. For example, die $100_0$ might respond to the counter signal C0 of trace $654_0$, die $100_1$ might respond to the counter signal C1 of trace $654_1$, die $100_2$ might respond to the counter signal C2 of trace $654_2$, and die $100_3$ might respond to the counter signal C3 of trace $654_3$.

Furthermore, the counter signals C0-C3 of the traces $654_0$-$654_3$ might be provided to each die $100_0$-$100_3$ as a combined control signal having D digits of information. Each of the dies $100_0$-$100_3$ might be assigned a respective value of the combined control signal. In this manner, die $100_0$ might respond to a value (e.g., digital value) of 1000, die $100_1$ might respond to a value of 0100, die $100_2$ might respond to a value of 0010, and die $100_3$ might respond to a value of 0001. While not considered essential to embodiments disclosed herein, U.S. Pat. No. 9,417,685 to Ha et al., which is commonly assigned, describes circuitry of a type that might be used to generate the counter signals C0-C3.

The following example of broadcasting expected peak current magnitude will use the counter signals C0-C3 for determining which die $100_0$-$100_3$ is designated to determine and broadcast its expected peak current magnitude. However, it will be apparent that any method of sequentially cycling through the dies may be used. Various embodiments utilize a shared control signal, such as the peak current magnitude indicator signal HC #, to provide an encoded value (e.g., a digital representation) of expected peak current magnitude by one die of a multi-die package to each remaining die of that multi-die package sharing the peak current magnitude indicator signal HC # of trace 656. Note that although the counter signals C0-C3 of traces $654_0$-$654_3$ are depicted to align with the clock signal ICLK of trace 650 in FIG. 6 as a matter of convenience, some delay might be expected when generating the counter signals C0-C3 from the clock signal ICLK, such that time t0 for the counter signals C0-C3 may not align with time t0 for the clock signal ICLK. Similarly, time t0 for the peak current magnitude indicator signal HC # may not align with time t0 for the clock signal ICLK. However, a transition of one of these signals at a particular time may be deemed to be responsive to a transition of the clock signal ICLK corresponding to that particular time.

For some embodiments, the look-ahead time for determining expected peak current magnitude might be greater than or equal to a period of time to cycle through the dies of the multi-die package, which can be referred to as the loop time. For example, the look-ahead time might be greater than or equal to a period of one of the counter signals C0-C3, such as a period of time greater than or equal to the time period from time t0 to time t16. The look-ahead time might further be less than (or equal to) the loop time plus a period of time to point to a next die, such as a period of time less than (or equal to) the time period from time t0 to time t16 and from time t16 to time t20, e.g., less than (or equal to) the value ((D+1)*loop time)/D. For example, the look-ahead time might be equal to 1.1 times the loop time. For some embodiments, the look-ahead time is less than 2 µs, and may be less than 1 µs. For some embodiments, the look-ahead time might be less than a duration of any phase of an operation for which power management is desired.

As one example, in a system having eight dies 100, and using one cycle of the clock signal ICLK to point to one of the dies 100 and three subsequent cycles of the clock signal ICLK to broadcast its expected peak current magnitude, the loop time might equal 32 clock cycles (8 dies*4 clock cycles) of the clock signal ICLK. If the clock signal ICLK had a period of 30 ns, the look-ahead time might be greater than or equal to 960 ns.

While the look-ahead time may consider a period of time extending from a present time and beyond, the look-ahead time might alternatively correspond entirely to a future period of time. For example, the die $100_0$ might determine at time t0 in FIG. 6 whether it is expected to experience a phase transition during a look-ahead time beginning at time t1 or later.

With reference to FIG. 6, trace $654_0$ might transition to a first logic level at time t0 and at time t16, trace $654_1$ might transition to the first logic level at time t4 and at time t20, trace $654_2$ might transition to the first logic level at time t8 and at time t24, and trace $654_3$ might transition to the first logic level at time t12 and at time t28. Traces $654_0$-$654_3$ might otherwise have a second logic level different than their first logic level. For the traces 654, their first logic level might be a logic high level and their second logic level might be a logic low level, for example.

In this example, the die $100_0$ might be designated at time t0, e.g., in response to trace $654_0$ transitioning to the first logic level. The die $100_0$ might then determine its expected peak current magnitude during the look-ahead time. Examples of how this determination might be made will reference FIG. 5 and Table 1.

Referring to FIG. 5, if the look-ahead time corresponds to time period $546_0$, die $100_0$ might be performing the phase of its operation 540 corresponding to the period of time from time t0 to time t1. As no transition to the next phase of its operation 540 is expected during the time period $546_0$, die $100_0$ might determine that its operation 540 can proceed, e.g., as the value of the total current usage would not be expected to change, and might determine to broadcast its present expected peak current magnitude, e.g., corresponding to the magnitude $544_0$, as its expected peak current magnitude during the look-ahead time. Die $100_0$ might then broadcast the digital representation corresponding to the magnitude $544_0$, or 000 in this example.

If the look-ahead time corresponds to time period $546_1$, die $100_0$ might be performing the phase of its operation 540 corresponding to the period of time from time t8 to time t9, but might be expected to transition to the phase of its operation 540 corresponding to the period of time from time t9 to time t10 during the time period $546_1$. As such, because the magnitude $544_1$ of its next phase is greater than the magnitude $544_0$ of its present phase, die $100_0$ might determine its expected peak current magnitude during the time period $546_1$ to be equal to the expected peak current magnitude $544_1$, e.g., the greater magnitude of its present phase and its next phase. Die $100_0$ might then determine if its expected peak current magnitude during the time period $546_1$, in combination (e.g., summed) with the expected peak current magnitudes of the other dies $100_1$-$100_3$, would be greater than (or equal to) a value of a total current usage budget. If the sum of the expected peak current magnitudes of the dies $100_0$-$100_3$ would not be greater than (or equal to) the value of the total current usage budget, die $100_0$ might determine to broadcast the expected peak current magnitude of its next phase, e.g., corresponding to the magnitude $544_1$, as its expected peak current magnitude during the look-ahead time. Die $100_0$ might then broadcast the digital representation corresponding to the magnitude $544_1$, or 001 in this example. The total current usage budget might be determined responsive to a customer requirement or industry standard, for example.

Conversely, if the sum of the expected peak current magnitudes of the dies $100_0$-$100_3$ would be greater than (or equal to) the value of the total current usage budget, die $100_0$ might determine to insert a pause before the next phase of its operation 540, and to broadcast the expected peak current magnitude of its present phase, e.g., corresponding to the magnitude $544_0$, as its expected peak current magnitude during the look-ahead time. Die $100_0$ might then broadcast the digital representation corresponding to the magnitude $544_0$ of the present phase, or 000 in this example. It is noted that if the sum of the expected peak current magnitudes of the dies $100_0$-$100_3$ would be greater than (or equal to) the value of the total current usage budget, die $100_0$ might alternatively re-evaluate the situation using an expected peak current magnitude of a low-peak-current operating mode of the next phase of its operation 540. If the sum of the expected peak current magnitudes of the dies $100_0$-$100_3$ in this re-evaluation would not be greater than (or equal to) the value of the total current usage budget, die $100_0$ might determine to broadcast the expected peak current magnitude of the low-peak-current operating mode of its next phase, or the expected peak current magnitude of its present phase, whichever is greater, as its expected peak current magnitude during the look-ahead time.

For some embodiments, the die $100_0$ might determine to insert a pause before the next phase of its operation 540 only if the expected peak current magnitude of the next phase is greater than the expected peak current magnitude of the present phase by some threshold. Such embodiments might increase performance if a system can be presumed to tolerate certain levels of peak current magnitude over the budget. Continuing with this example, if the threshold were 30 mA, the die $100_0$ might determine not to insert a pause, even if the sum of the expected peak current magnitudes of the dies $100_0$-$100_3$ would be greater than (or equal to) the value of the total current usage budget, as the magnitude $544_1$ of the next phase is greater than the magnitude $544_0$ of the present phase by only 25 mA.

For other embodiments, the die $100_0$ might further determine to insert a pause before the next phase of its operation 540 if a rate of change in the sum of the expected peak current magnitudes of the dies $100_0$-$100_3$ would be greater than some threshold, even if the sum of the expected peak current magnitudes of the dies $100_0$-$100_3$ would be less than the value of the total current usage budget. Such embodiments might mitigate dips in a supply voltage caused by package inductance. For example, the die $100_0$ might compare the sum of the expected peak current magnitudes of the dies $100_0$-$100_3$ for the next phase to an earlier sum of the expected peak current magnitudes of the dies $100_0$-$100_3$, and insert a pause if the rate of change is greater than the threshold. The earlier sum of the expected peak current magnitudes of the dies $100_0$-$100_3$ might be a value determined by the die $100_0$ when it was designated in a prior loop, or might be a value determined in response to storing an expected peak current magnitude of some other die $100_1$-$100_3$.

If the look-ahead time corresponds to time period $546_2$, die $100_0$ might be performing the phase of its operation 540 corresponding to the period of time from time t6 to time t7, but might be expected to transition to the phase of its operation 540 corresponding to the period of time from time t7 to time t8 during the time period $546_2$. As such, because the magnitude $544_2$ of its next phase is less than the magnitude $544_5$ of its present phase, die $100_0$ might determine its expected peak current magnitude during the time period $546_2$ to be equal to the expected peak current magnitude $544_5$, e.g., the greater magnitude of its present phase and its next phase. As no increase in expected peak current magnitude is expected, die $100_0$ might determine that its operation 540 can proceed, e.g., as the value of the total current usage would not be expected to increase, and might determine to broadcast its present expected peak current magnitude, e.g., corresponding to the magnitude $544_5$, as its expected peak current magnitude during the look-ahead time. Die $100_0$ might then broadcast the digital representation corresponding to the magnitude $544_5$, or 101 in this example.

Although it may be desirable to select a look-ahead time that is less than a duration of any phase of the operations to be performed by a die 100, and to be subject to methods as described herein, the time period $546_3$ considers the example where more than one phase transition is expected in the look-ahead time. As such, if the look-ahead time corresponds to time period $546_3$, die $100_0$ might be performing the phase of its operation 540 corresponding to the period of time from time t1 to time t2, but might be expected to transition to the phase of its operation 540 corresponding to the period of time from time t2 to time t3, and to further transition to the phase of its operation 540 corresponding to the period of time from time t3 to time t4, during the time period $546_3$. Because the magnitude $544_6$ of its next phase is greater than the magnitude $544_3$ of its present phase, and greater than the magnitude $544_2$ of its subsequent phase, die $100_0$ might determine its expected peak current magnitude during the time period $546_3$ to be equal to the expected peak current magnitude $544_6$, e.g., the greater magnitude of each phase performed (e.g., at least partially) during the time period $546_3$. Determination as to whether to proceed or pause can be made as discussed with reference to the time period $546_1$, e.g., if the magnitude of the next phase or any subsequent phase during the time period $546_3$ is greater than the magnitude of the present phase, or with reference to time period $546_2$, e.g., if the magnitude of the next phase and each subsequent phase during the time period $546_3$ is less than or equal to the magnitude of the present phase.

For phases that lack a defined duration, some embodiments might presume that a phase transition will occur during the look-ahead time, such that the expected peak current magnitude of that die 100 might be the expected peak current magnitude of its next phase of the operation, even though the operation may not transition to the next phase during the look-ahead time. If the sum of the expected peak current magnitudes of the dies $100_0$-$100_3$ would lead to a determination to pause the operation, the pause could be inserted before the next phase. If the operation did transition to the next phase, the die 100 might be put into an idle state, and if the operation did not transition to the next phase, the operation might simply continue with the present phase. It is recognized that allowing the broadcast expected peak current magnitude to be equal to the expected peak current magnitude of the next phase might reserve more current than needed where no transition occurs.

For certain embodiments, one or more of the encoded values indicative of the expected peak current magnitudes might further correspond to phases, or types of phases, that should not be performed concurrently, e.g., regardless of the total current usage budget. As such, if a die 100 is expected a transition to one such phase within its look-ahead time, it might further determine if any other die 100 broadcast an encoded value corresponding to such a phase within the last loop, and may determine to insert a pause if such an encoded value had been broadcast in order to avoid concurrent performance of such phases.

A method of broadcasting the expected peak current magnitude of each die 100 will be discussed with reference to FIG. 6 and Table 1. The following example will presume that the determinations of expected peak current magnitude of each die are performed and that no operation is expected to be paused as it is provided merely to demonstrate how representations of expected peak current magnitude can be broadcast and shared by the dies. Consider the example where die $100_0$ determines at time t0 that its expected peak current magnitude for the look-ahead time (e.g., for a period of time greater than or equal to the period of time from time t0 to time t16) is less than 25 mA, where die $100_1$ determines at time t4 that its expected peak current magnitude for the look-ahead time is less than 200 mA, where die $100_2$ determines at time t8 that its expected peak current magnitude for the look-ahead time is less than 50 mA, where die $100_3$ determines at time t12 that its expected peak current magnitude for the look-ahead time is less than 125 mA, where die $100_0$ determines at time t16 that its expected peak current magnitude for the look-ahead time is less than 75 mA, where die $100_1$ determines at time t20 that its expected peak current magnitude for the look-ahead time is less than 100 mA, where die $100_2$ determines at time t24 that its expected peak current magnitude for the look-ahead time is less than 150 mA, and where die $100_3$ determines at time t28 that its expected peak current magnitude for the look-ahead time is less than 175 mA.

Figure 7A:
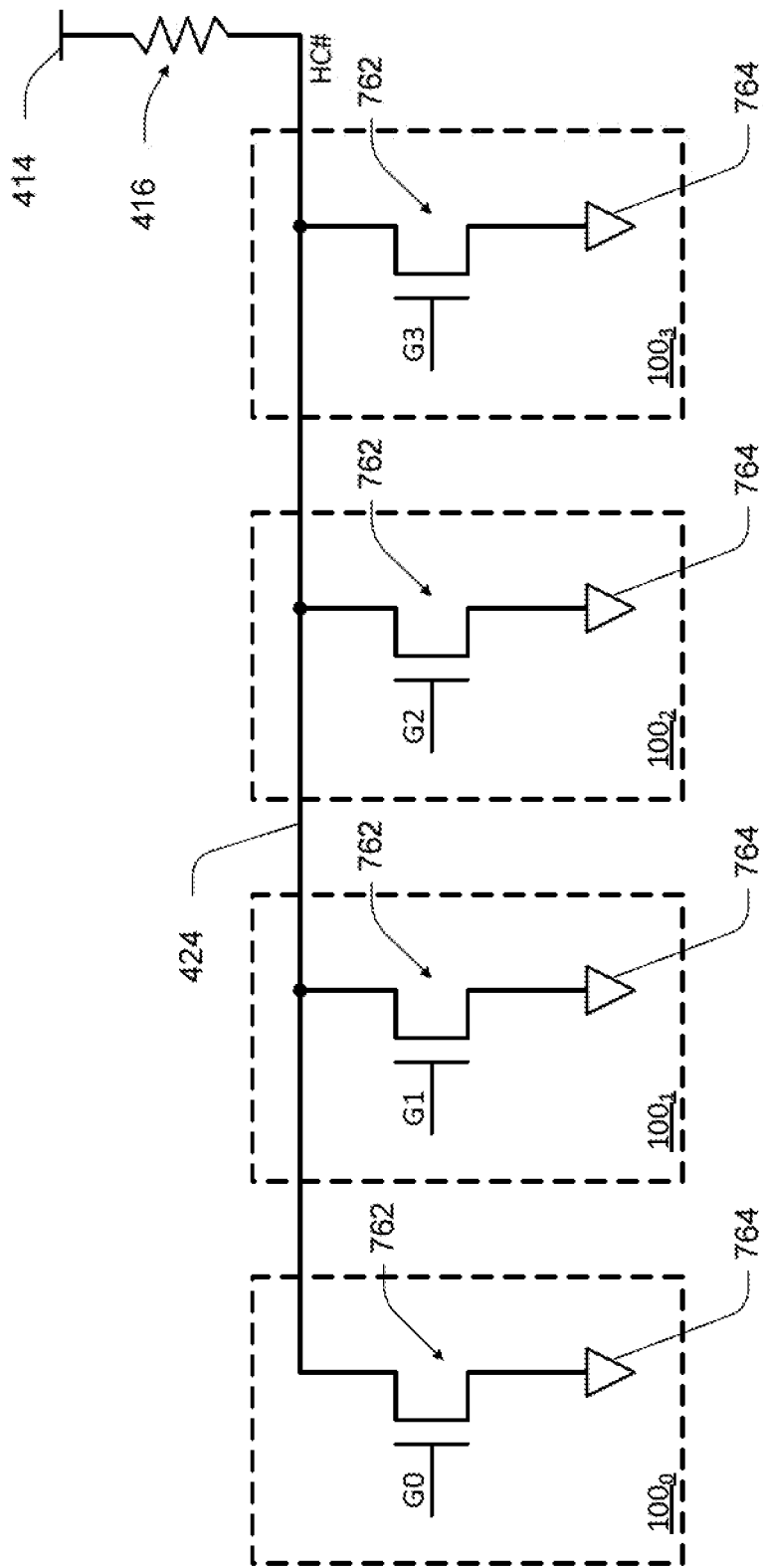
FIGS. 7A-7B are simplified schematics of circuits for generating a peak current magnitude indicator signal for use with embodiments.
Figure 7B:
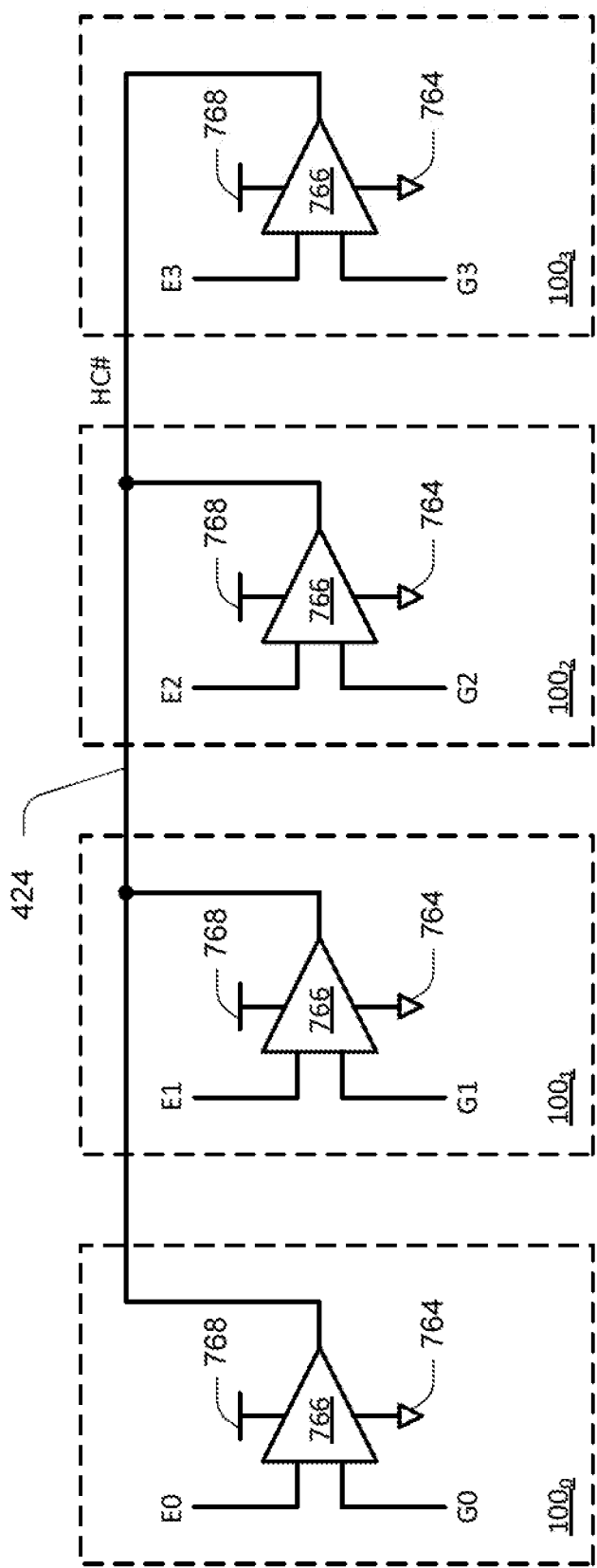

In this example, the die $100_0$ might be designated at time t0, e.g., in response to trace $654_0$ transitioning to the first logic level. The die $100_0$ might then broadcast a digital representation of its expected peak current magnitude of less than 25 mA using (e.g., by selectively transitioning) the peak current magnitude indicator signal HC # of trace 656 over the course of one or more subsequent cycles of the clock signal ICLK of trace 650. In this example, the die $100_0$ might transition the peak current magnitude indicator signal HC # from a first logic level (e.g., a logic high level) to a second logic level (e.g., a logic low level) for the cycles of the clock signal ICLK corresponding to times t1, t2 and t3 to represent a digital value of 000. FIGS. 7A-7B are simplified schematics of circuits for generating a peak current magnitude indicator signal HC # for use with embodiments.

As depicted in FIG. 7A, the dies $100_0$-$100_3$ commonly share the peak current magnitude indicator signal HC # via signal line 424. The peak current magnitude indicator signal HC # might be normally pulled to a logic high level using voltage supply node 414 and resistor 416, for example. For each of the dies $100_0$-$100_3$, another voltage supply node, such as reference potential node 764 coupled to receive a reference potential, such as a ground or Vss, may be selectively connected to the signal line 424 through a switch, e.g., a transistor 762, each having a control gate coupled to receive a control signal. For example, die 100$_0$ may have the control gate of its transistor 762 coupled to receive the control signal G0 generated by the die 100$_0$, die 100$_1$ may have the control gate of its transistor 762 coupled to receive the control signal G1 generated by the die 100$_1$, die 100$_2$ may have the control gate of its transistor 762 coupled to receive the control signal G2 generated by the die 100$_2$, and die 100$_3$ may have the control gate of its transistor 762 coupled to receive the control signal G3 generated by the die 100$_3$. These control signals might be generated (e.g., by the controllers of the dies) to activate their respective transistor 762 when their respective die 100 intends to indicate the second logic level, and to deactivate their respective transistor 762 when their respective die 100 intends to indicate the first logic level, or when their respective die 100 is not designated to broadcast its expected peak current magnitude. In the example of FIG. 7A, when any transistor 762 is activated, the voltage level of the signal line 424 will be pulled to a logic low level, and the voltage level of the signal line 424 will be pulled back to a logic high level when none of the transistors 762 are activated.

As depicted in FIG. 7B, the dies 100$_0$-100$_3$ commonly share the peak current magnitude indicator signal HC # via signal line 424. The peak current magnitude indicator signal HC # might be normally floating unless actively driven by one of the dies 100$_0$-100$_3$. Each of the dies 100$_0$-100$_3$, might include a driver 766, which might be configured, when enabled, to selectively connect its output to a particular voltage supply node 764 or 768 corresponding to the desired logic level of the signal line 424, or, when disabled, to present a high impedance (high Z) state to the signal line 424 by isolating its output from both voltage supply nodes 764 and 768. For example, die 100$_0$ might generate the control signal E1 to have a logic low level to disable its driver 766 and isolate its output from its voltage supply nodes 764 and 768, or to have a logic high level to enable its driver 766 to connect its output to either its voltage supply node 764 or its voltage supply node 768 in response to a logic level of its control signal G0. To continue with this example, if the die 100$_0$ generates the control signal G0 to have a logic low level, its driver 766 might be configured to connect its output to its voltage supply node 764, and if the die 100$_0$ generates the control signal G0 to have a logic high level, its driver 766 might be configured to connect its output to its voltage supply node 768. Remaining dies 100$_1$-100$_3$ might be similarly configured. In this manner, one of the dies 100 could drive the logic level of the signal line 424 with its driver 766 when designated, while the remaining dies 100 might each present a high impedance from their drivers 766. Other circuitry for commonly sharing the peak current magnitude indicator signal HC # could also be used where each die 100 is configured to selectively transition a logic level of the signal line 424.

Continuing with the example of FIG. 6, the die 100$_1$ might be designated at time t4, e.g., in response to trace 654$_1$ transitioning to the first logic level. The die 100$_1$ might then broadcast a digital representation of its expected peak current magnitude of less than 200 mA using (e.g., by selectively transitioning) the peak current magnitude indicator signal HC # of trace 656 over the course of one or more subsequent cycles of the clock signal ICLK of trace 650. In this example, the die 100$_1$ might maintain the peak current magnitude indicator signal HC # at the first logic level for the cycles of the clock signal ICLK corresponding to times t5, t6 and t7 to represent a digital value of 111.

The die 100$_2$ might be designated at time t8, e.g., in response to trace 654$_2$ transitioning to the first logic level. The die 100$_2$ might then broadcast a digital representation of its expected peak current magnitude of less than 50 mA using (e.g., by selectively transitioning) the peak current magnitude indicator signal HC # of trace 656 over the course of one or more subsequent cycles of the clock signal ICLK of trace 650. In this example, the die 100$_2$ might transition the peak current magnitude indicator signal HC # to the second logic level for the cycles of the clock signal ICLK corresponding to times t9 and t10, and transition the peak current magnitude indicator signal HC # to the first logic level for the cycle of the clock signal ICLK corresponding to time t11, to represent a digital value of 001.

The die 100$_3$ might be designated at time t12, e.g., in response to trace 654$_3$ transitioning to the first logic level. The die 100$_3$ might then broadcast a digital representation of its expected peak current magnitude of less than 125 mA using (e.g., by selectively transitioning) the peak current magnitude indicator signal HC # of trace 656 over the course of one or more subsequent cycles of the clock signal ICLK of trace 650. In this example, the die 100$_3$ might maintain the peak current magnitude indicator signal HC # at the first logic level for the cycle of the clock signal ICLK corresponding to time t13, and transition the peak current magnitude indicator signal HC # to the second logic level for the cycles of the clock signal ICLK corresponding to times t14 and t15, to represent a digital value of 100.

The die 100$_0$ might be designated at time t16, e.g., in response to trace 654$_0$ transitioning to the first logic level. The die 100$_0$ might then broadcast a digital representation of its expected peak current magnitude of less than 75 mA using (e.g., by selectively transitioning) the peak current magnitude indicator signal HC # of trace 656 over the course of one or more subsequent cycles of the clock signal ICLK of trace 650. In this example, the die 100$_0$ might transition the peak current magnitude indicator signal HC # to the second logic level for the cycle of the clock signal ICLK corresponding to time t17, transition the peak current magnitude indicator signal HC # to the first logic level for the cycle of the clock signal ICLK corresponding to time t18, and transition the peak current magnitude indicator signal HC # to the second logic level for the cycle of the clock signal ICLK corresponding to time t19, to represent a digital value of 010.

The die 100$_1$ might be designated at time t20, e.g., in response to trace 654$_1$ transitioning to the first logic level. The die 100$_1$ might then broadcast a digital representation of its expected peak current magnitude of less than 100 mA using (e.g., by selectively transitioning) the peak current magnitude indicator signal HC # of trace 656 over the course of one or more subsequent cycles of the clock signal ICLK of trace 650. In this example, the die 100$_1$ might transition the peak current magnitude indicator signal HC # to the second logic level for the cycle of the clock signal ICLK corresponding to time t21, and transition the peak current magnitude indicator signal HC # to the first logic level for the cycles of the clock signal ICLK corresponding to times t22 and t23, to represent a digital value of 011.

The die 100$_2$ might be designated at time t24, e.g., in response to trace 654$_2$ transitioning to the first logic level. The die 100$_2$ might then broadcast a digital representation of its expected peak current magnitude of less than 150 mA using (e.g., by selectively transitioning) the peak current magnitude indicator signal HC # of trace 656 over the course of one or more subsequent cycles of the clock signal ICLK of trace 650. In this example, the die 100$_2$ might maintain the peak current magnitude indicator signal HC # at the first logic level for the cycle of the clock signal ICLK corresponding to time t25, transition the peak current magnitude indicator signal HC # to the second logic level for the cycle of the clock signal ICLK corresponding to time t26, and transition the peak current magnitude indicator signal HC # to the first logic level for the cycle of the clock signal ICLK corresponding to time t27, to represent a digital value of 101.

The die 100$_3$ might be designated at time t28, e.g., in response to trace 654$_3$ transitioning to the first logic level. The die 100$_3$ might then broadcast a digital representation of its expected peak current magnitude of less than 175 mA using (e.g., by selectively transitioning) the peak current magnitude indicator signal HC # of trace 656 over the course of one or more subsequent cycles of the clock signal ICLK of trace 650. In this example, the die 100$_3$ might maintain the peak current magnitude indicator signal HC # at the first logic level for the cycles of the clock signal ICLK corresponding to times t29 and t30, and transition the peak current magnitude indicator signal HC # to the second logic level for the cycle of the clock signal ICLK corresponding to time t31, to represent a digital value of 110.

In view of the foregoing example, it will be clear that different orders of digital representations might be represented using fewer or more clock cycles of the clock signal ICLK to represent lower or higher degrees of granularity, respectively, of expected peak current magnitudes. In addition, while the foregoing example completed broadcasting the digital representation for one die before a next die was designated, these two acts could overlap. For example, the counter signal C0 could transition at time t0, and die 100$_0$ could broadcast its digital representation at times t1, t2 and t3 as depicted in FIG. 6. However, in this alternative example, the counter signal C1 could transition at time t3, e.g., while die 100$_0$ is broadcasting a last digit of its digital representation, and die 100$_1$ could begin broadcasting its digital representation at time t4. Similarly, the counter signal C2 could transition at time t6, e.g., while die 100$_1$ is broadcasting a last digit of its digital representation, and die 100$_2$ could begin broadcasting its digital representation at time t7, and so on.

Figure 8:
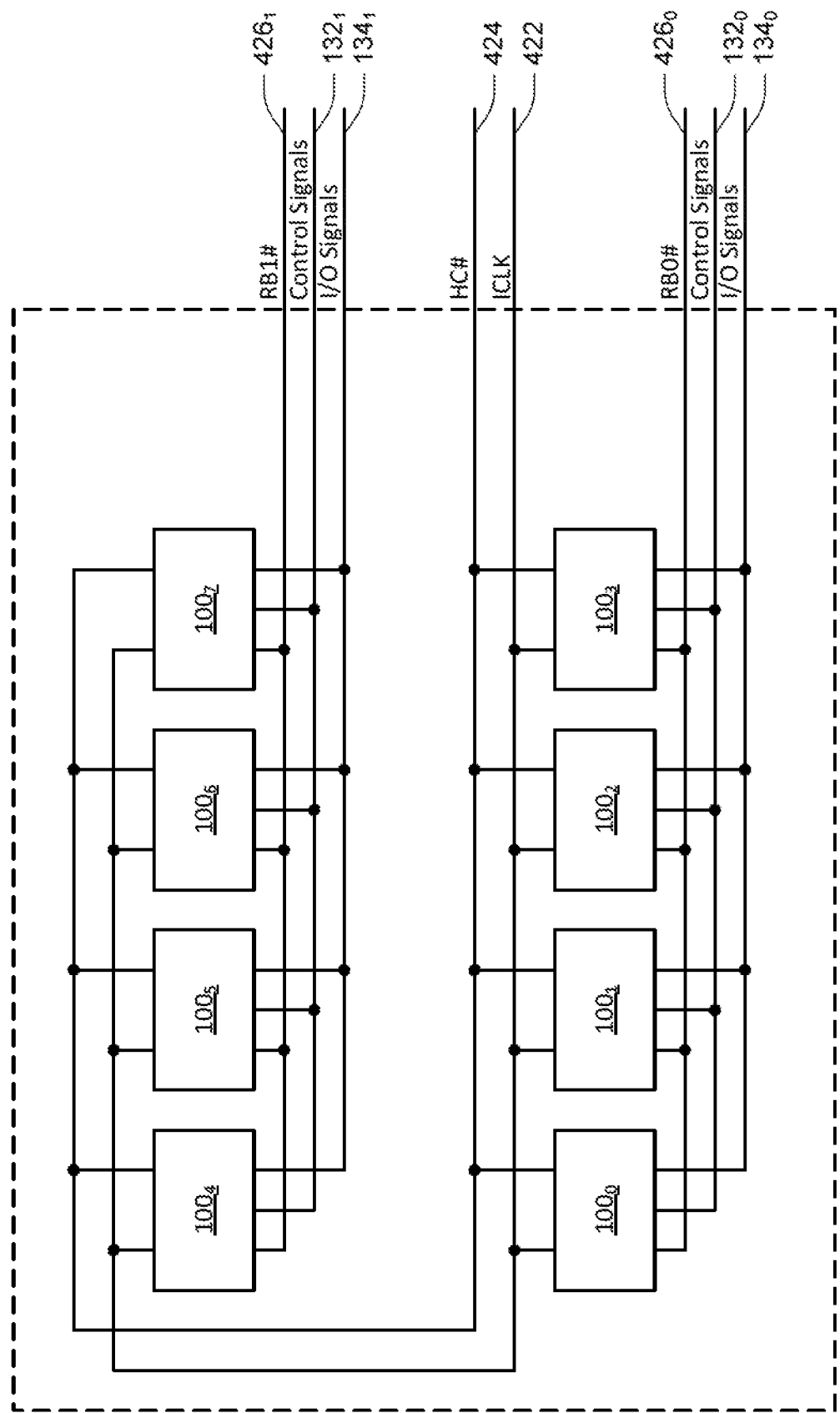
FIG. 8 is a schematic representation of a multi-die package according to another embodiment.

FIG. 8 is a schematic representation of a multi-die package including eight dies 100 (e.g., 100$_0$-100$_7$) according to another embodiment. The clock signal ICLK is commonly shared between the dies 100 through a clock signal line 422. Dies 100$_0$-100$_7$ might be part of a package 302. Dies 100$_0$-100$_3$ might be selectively enabled in response to a chip enable signal CE0 # (not depicted) as part of control link 132$_0$, and might communicate over I/O bus 134$_0$. Dies 100$_4$-100$_7$ might be selectively enabled in response to a chip enable signal CE1 # (not depicted) as part of control link 132$_1$ that is separate from the control link 132$_0$, and might communicate over I/O bus 134$_1$ that is separate from the I/O bus 134$_0$.

The peak current magnitude indicator signal HC # is commonly shared between the dies 100 through a signal line 424. The peak current magnitude indicator signal HC # may be normally pulled to a particular state (e.g., pulled high). The ready/busy control signal RB0 # is commonly shared between the dies 100$_0$-100$_3$ through a control signal line 426$_0$. The ready/busy control signal RB1 # is commonly shared between the dies 100$_4$-100$_7$ through a control signal line 426$_1$. The ready/busy control signals RB0 # and RB1 # may both be normally pulled to a particular state (e.g., pulled high) independently of one another. For such an example, embodiments might cycle through each of the dies 100 for determining and broadcasting expected peak current magnitude, even though some of the dies 100 might be disabled in response to their respective chip enable signal. For embodiments sharing the peak current magnitude indicator signal HC # in a manner such as described with reference to FIG. 7A, the encoded value for the lowest expected peak current magnitude might be configured such that each of its digits correspond to the normal logic level of the peak current magnitude indicator signal HC # where the disabled dies 100 do not transition the peak current magnitude indicator signal HC #. Alternatively, for embodiments sharing the peak current magnitude indicator signal HC # in a manner such as described with reference to FIG. 7B, the dies 100 might be configured, when otherwise disabled in response to their respective chip enable signal, to drive transitions of the peak current magnitude indicator signal HC # to indicate the encoded value for the lowest expected peak current magnitude upon being designated.

Figure 9:
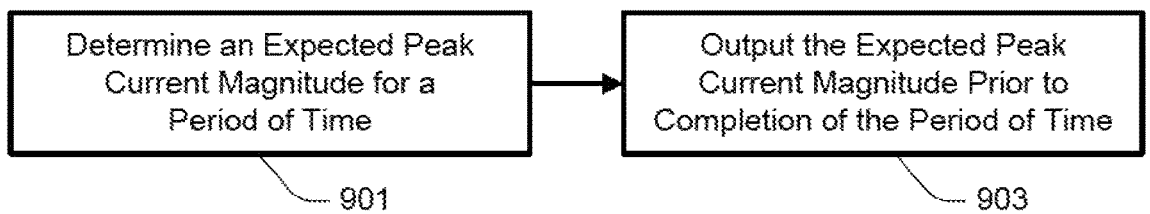
FIG. 9 is a flowchart of a method of operating a die in accordance with an embodiment.

FIG. 9 is a flowchart of a method of operating a die in accordance with an embodiment. With regard to FIG. 9, at 901, a die (e.g., a memory) might determine an expected peak current magnitude for a period of time, e.g., a look-ahead time. The expected peak current magnitude for the period of time might be a present expected peak current magnitude of the die, or an expected peak current magnitude of a next phase of an operation to be performed by the die. At 903, the die might output the expected peak current magnitude for the period of time before completion of the period of time, which might include outputting the expected peak current magnitude for the period of time before initiation of the period of time. The die might be a particular die of a plurality of dies in communication with each other. Output of the expected peak current magnitude might include broadcasting the expected peak current magnitude to each remaining die of the plurality of dies.

Figure 10A:
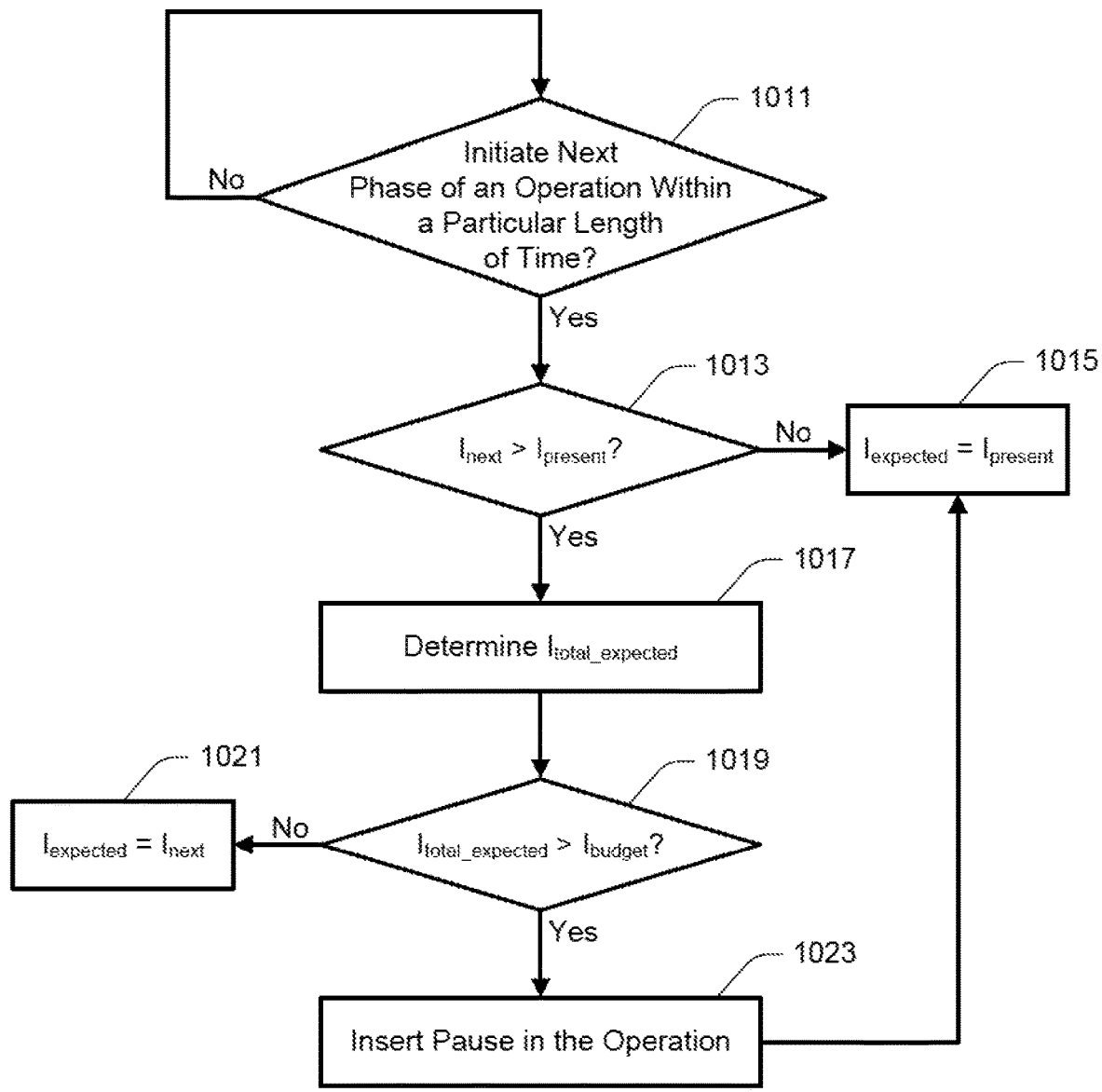
FIGS. 10A-10B are flowcharts of methods of operating a die in accordance with embodiments.
Figure 10B:
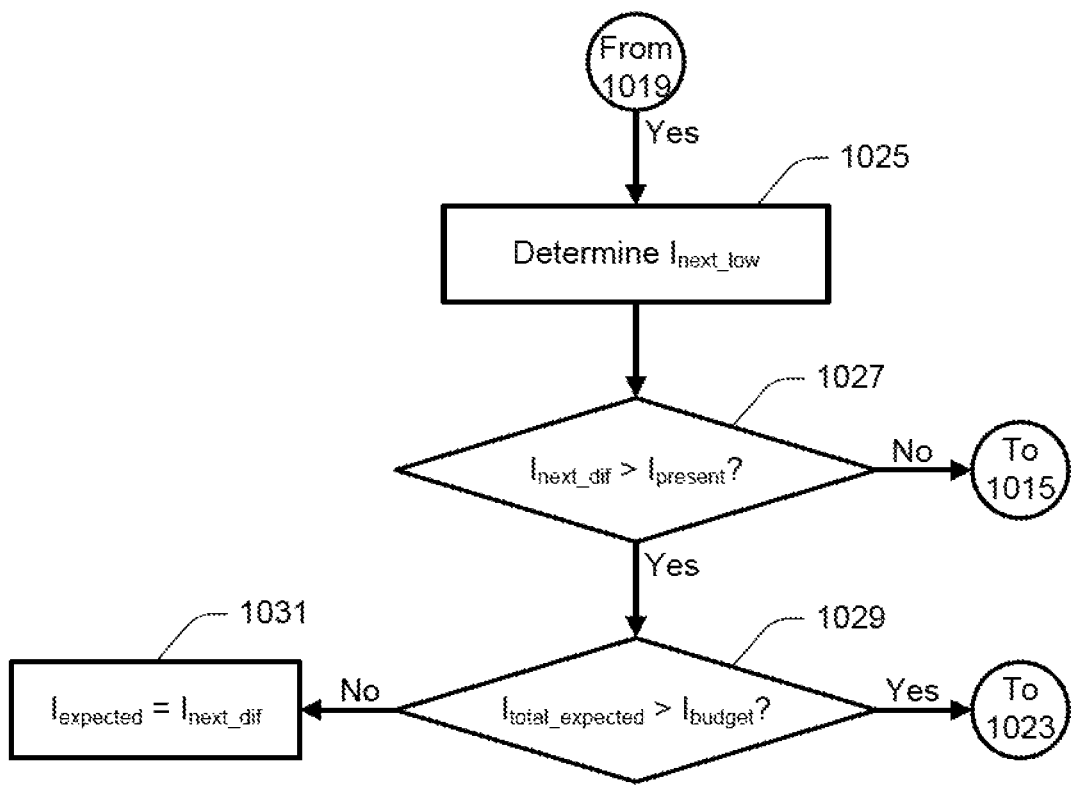

FIGS. 10A-10B are flowcharts of methods of operating a die in accordance with embodiments. With regard to FIG. 10A, at 1011, a die (e.g., a memory) might determine whether it would initiate a next phase of an operation within a particular length of time, e.g., a look-ahead time. The next phase of the operation might include an initial phase of an operation that has not yet started. A determination whether a transition would be expected to occur might include starting a timer (e.g., timer 128) in response to initiating a phase (e.g., a prior phase) of an operation, and setting an interval of the timer to equal the duration of the phase minus the particular length of time. In this manner, the timer reaching the end of its interval and changing its output would signal to the die that a transition would be expected within the particular length of time for the next determination at 1011. Alternatively, or in addition, a die might make a determination that a transition is expected if the die is idle, and an operation is waiting to start. Other manners of making such a determination may also be used.

If no transition is expected, the method might return to 1011 to make the determination again, e.g., after being designated to make such a determination. If a transition is expected at 1011, the die might determine at 1013 whether the expected peak current magnitude of the next phase is greater than its present expected peak current magnitude, which might include an expected peak current magnitude while idle, or an expected peak current magnitude for a last phase of a prior operation.

If the expected peak current magnitude of the next phase is not greater than its present expected peak current magnitude at 1013, the die might determine its expected peak current magnitude during the particular length of time to be equal to its present expected peak current magnitude at 1015. If the expected peak current magnitude of the next phase is greater than its present expected peak current magnitude at 1013, the die might proceed to 1017.

At 1017, the die might determine a total of expected peak current magnitudes of a plurality of dies using the expected peak current magnitude of the next phase. For example, the total of expected peak current magnitudes might be responsive to expected peak current magnitudes received (e.g., previously received) from each remaining die of the plurality of dies, as well as the expected peak current magnitude of this die for its next phase. If this total of expected peak current magnitudes is less than (or equal to) a particular value, e.g., a total current usage budget, the die might determine its expected peak current magnitude during the particular length of time to be equal to the expected peak current magnitude of the next phase at 1021. If this total of expected peak current magnitudes is greater than (or equal to) the particular value, the die might determine to insert a pause in the operation before the next phase at 1023. Inserting a pause might include setting a value of a register to a particular value, such that if the register has the particular value, the die might wait to transition to the next phase until the value of the register is reset to a different value, e.g., in response to subsequently determining at 1019 that the total of expected peak current magnitudes is now less than (or equal to) its particular value, e.g., the total current usage budget.

With regard to FIG. 10B, a variation of the method of FIG. 10A is described. Instead of proceeding from 1019 to 1023 if the total of expected peak current magnitudes is greater than (or equal to) the particular value, the die might determine an expected peak current magnitude if the next phase were to be operated in a different operating mode at 1025, e.g., in a low-peak-current operating mode instead of a normal operating mode. The die might then determine whether the expected peak current magnitude of the next phase in the different operating mode is greater than the present expected peak current magnitude at 1027. If not, the method might return to 1015. Otherwise, the die might then re-evaluate whether a total of expected peak current magnitudes of the plurality of dies using the expected peak current magnitude of the next phase in the different operating mode is greater than (or equal to) the particular value at 1029. If so, the method might then proceed to 1023. If not, the die might determine its expected peak current magnitude during the particular length of time to be equal to the expected peak current magnitude of the next phase in the different operating mode at 1031.

Figure 11:
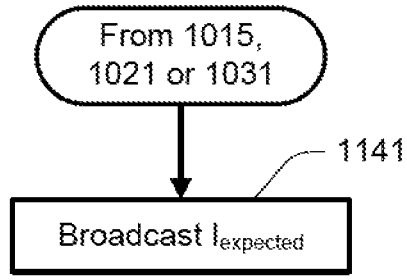
FIG. 11 is a flowchart of a method of operating a die in accordance with a further embodiment.

FIG. 11 is a flowchart of a method of operating a die in accordance with a further embodiment. At 1141, the expected peak current magnitude during the particular length of time, as determined at 1015, 1021 or 1031 of FIGS. 10A-10B, might be broadcast, e.g., as described with reference to FIG. 6.

Figure 12:
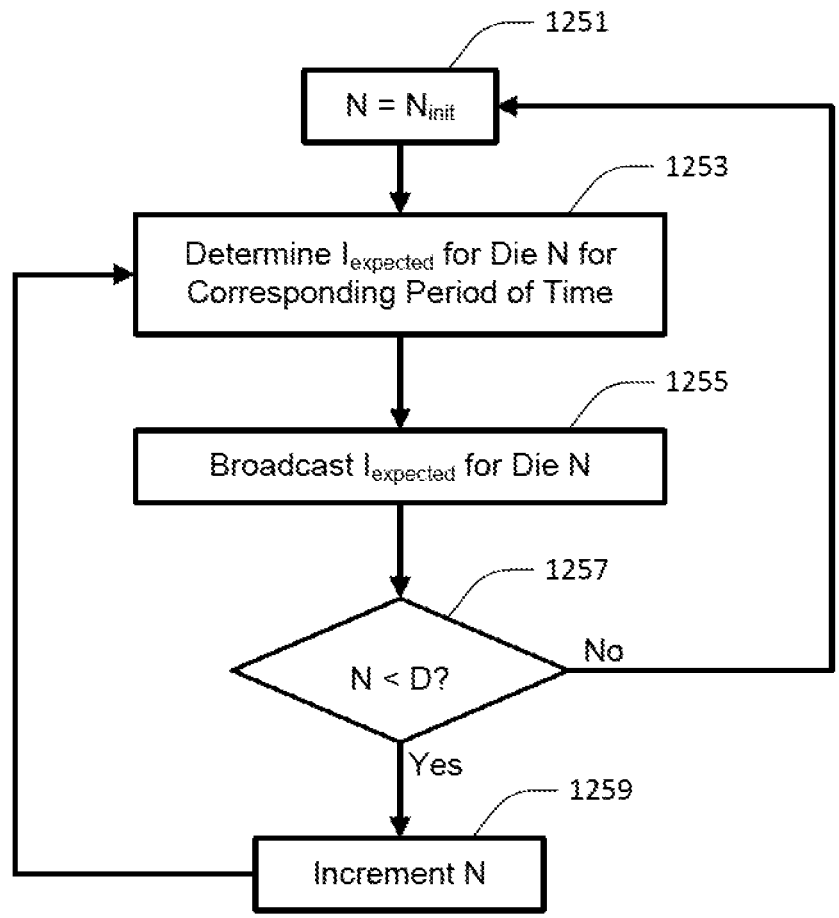
FIG. 12 is a flowchart of a method of operating a plurality of dies in accordance with an embodiment.

FIG. 12 is a flowchart of a method of operating a plurality of dies in accordance with an embodiment. At 1251, a value of N might be set to an initial value, $N_{init}$. The value of N might be an integer value, and might represent a value of a die pointer. The initial value $N_{init}$ might be 0 or 1, for example. The value of N might range from its initial value to an integer value D, where $(D-N_{init}+1)$ equals a number of dies of a plurality of dies. At 1253, the die N might determine an expected peak current magnitude during a corresponding period of time, e.g., as described with reference to FIGS. 10A and/or 10B. The corresponding period of time for any die of the plurality of dies might be overlapping with corresponding periods of time for each remaining die of the plurality of dies. The corresponding period of time for any die of the plurality of dies might have a same duration as the corresponding periods of time for each remaining die of the plurality of dies. The corresponding period of time for die N might begin later than the corresponding period of time for die (N−1), and earlier than the corresponding period of time for die (N+1), e.g., the corresponding periods of time might be sequential and overlapping.

At 1255, the expected peak current magnitude during the corresponding period of time for Die N might be broadcast to remaining dies of the plurality of dies. At 1257, it might be determined whether the value of N is less than D. If N equals D, the method might return to 1251 to set the value of N to its initial value $N_{init}$. If N is less than D, the value of N might be changed, e.g., incremented, at 1259, and the method might return to 1253. While the method of FIG. 12 considered a sequence from a lowest numbered die to a highest numbered die of a plurality of dies, a sequence from a highest numbered die to a lowest numbered die of the plurality of dies, or any sequence that would make a determination of expected peak current magnitude once for each die of the plurality of dies before returning N to its initial value $N_{init}$, would be deemed to be equivalent.

Figure 13:
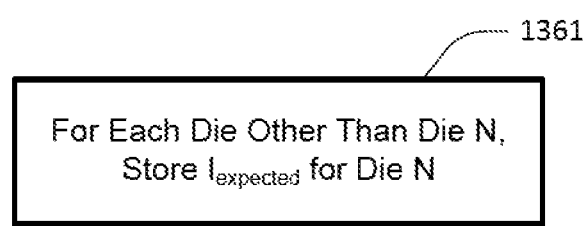
FIG. 13 is a flowchart of a method of operating a plurality of dies in accordance with a further embodiment.

FIG. 13 is a flowchart of a method of operating a plurality of dies in accordance with a further embodiment. At 1361, in response to the broadcast of the expected peak current magnitude during the particular length of time for Die N at 1255 of FIG. 12, each die of the plurality of dies other than die N might store the expected peak current magnitude for the particular length of time for Die N.

Figures 14, 15:
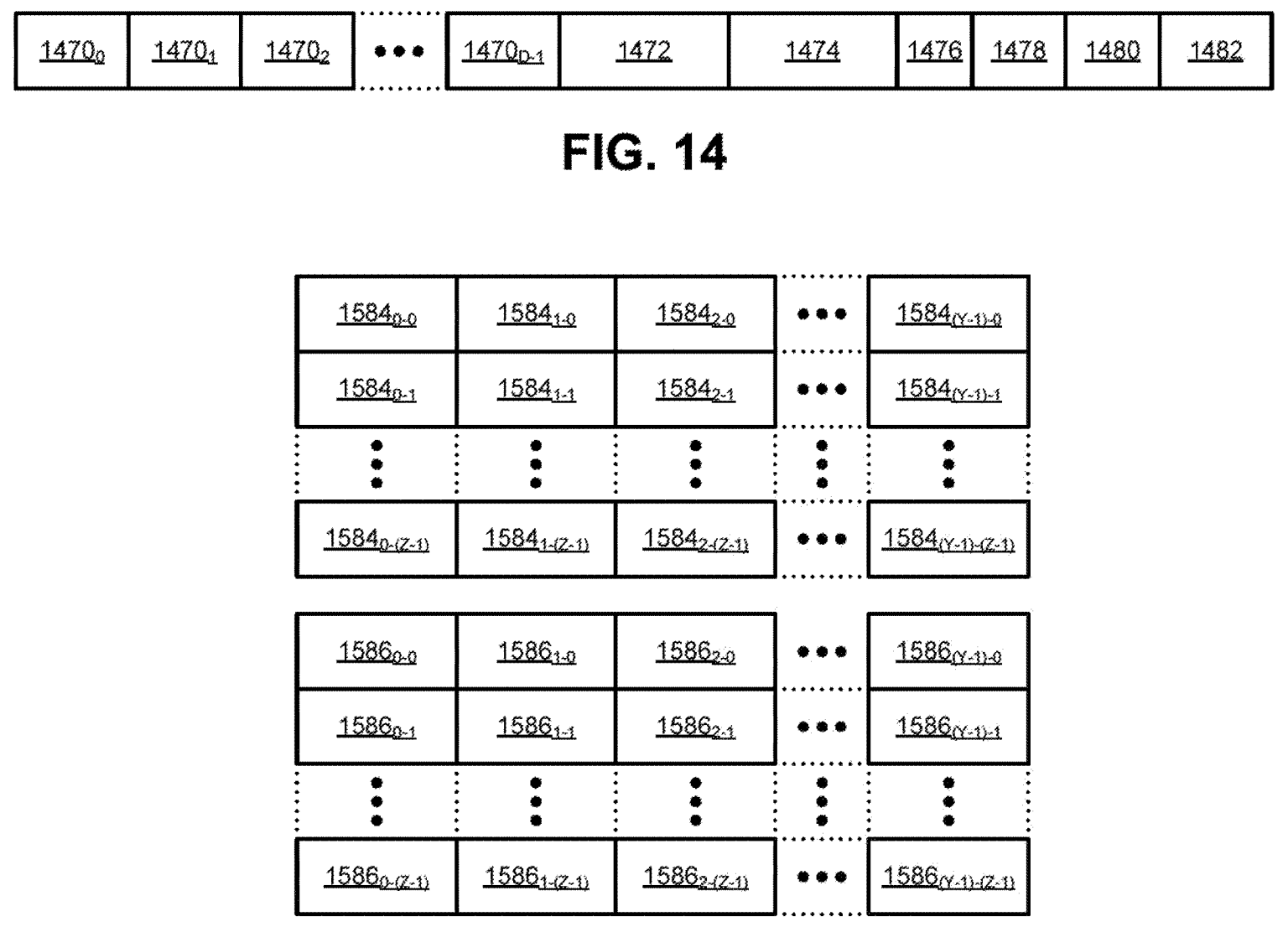

FIG. 14 is a block diagram of registers that might be used with embodiments. Various embodiments might make use of registers for storage of data to be used in their performance. Registers might represent volatile or non-volatile memory, latches or other storage locations. The example of FIG. 14 depicts D registers 1470, e.g., registers $1470_0$-$1470_{D-1}$, for storage of expected peak current magnitudes determined by the die containing the registers 1470, and received from other dies in communication with that die. FIG. 14 further depicts a register 1472 that might store a sum of the registers 1470, and a register 1474 that might store a value corresponding to a total current usage budget for the die. Registers 1470, 1472 and 1474 might generally store multiple digits of data.

FIG. 14 further depicts a register 1476 that might store a flag value that might indicate whether an operation is to pause before initiating a next phase, which may include an initial phase of the operation. Register 1476 might contain a single digit, e.g., a value of 0 if a pause is desired, or a value of 1 if not. FIG. 14 further depicts a register 1478 that might indicate which operation is currently active (which may include an idle state), a register 1480 that might indicate which phase is currently active (which might include an idle state), and a register 1482 that might store a value corresponding to the look-ahead time. Registers 1478, 1480 and 1482 might generally store multiple digits of data. Values stored to the registers 1470-1482 might be used as described herein. Additional registers might also be used, such as a value corresponding to a prior sum of registers 1470 for use in determining a rate of change of the expected peak current magnitudes, for example.

FIG. 15 is a block diagram of other registers that might be used with embodiments. FIG. 15 depicts registers 1584, e.g., registers $1584_{0\text{-}0}$-$1584_{(Y\text{-}1)\text{-}(Z\text{-}1)}$, for storage of up to Y phase durations for each operation of up to Z operations. FIG. 15 further depicts registers 1586, e.g., registers $1586_{0\text{-}0}$-$1586_{(Y\text{-}1)\text{-}(Z\text{-}1)}$, for storage of expected peak current magnitudes for each phase of up to Y phases for each operation of up to Z operations. Values stored to the registers 1584 and 1586 might be used as described herein. The Z operations might represent both normal operating mode operations and low-peak-current operating mode operations, and may further include an idle state.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A method, comprising:
   determining whether a die is expected to make a transition during a period of time, wherein the transition is selected from a group consisting of initiating a next phase of an operation being performed by the die and initiating a first phase of a next operation to be performed by the die;
   determining an expected peak current magnitude of the die for the period of time after determining whether the die is expected to make the transition during the period of time; and
   outputting the expected peak current magnitude from the die prior to completion of the period of time.

2. The method of claim 1, wherein the die is a particular die of a plurality of dies and the period of time is a particular period of time of a plurality of periods of time, the method further comprising:
   determining whether a different die of the plurality of dies is expected to make a transition during a different period of time of the plurality of periods of time, wherein the transition of the different die is selected from a group consisting of initiating a next phase of an operation being performed by the different die and initiating a first phase of a next operation to be performed by the different die;
   determining an expected peak current magnitude of the different die for the different period of time after determining whether the different die is expected to make the transition of the different die during the different period of time; and
   outputting the expected peak current magnitude of the different die from the different die prior to completion of the different period of time.

3. The method of claim 2, wherein completion of the different period of time occurs after completion of the particular period of time.

4. The method of claim 3, wherein the particular period of time and the different period of time have a same duration.

5. The method of claim 2, further comprising:
   for each remaining die of the plurality of dies:
     determining whether that die is expected to make a transition during a respective period of time of the plurality of periods of time, wherein the transition of that die is selected from a group consisting of initiating a next phase of an operation being performed by that die and initiating a first phase of a next operation to be performed by that die;
     determining an expected peak current magnitude of that die for its respective period of time after determining whether that die is expected to make the transition of that die during its respective period of time; and
     outputting the expected peak current magnitude of that die from that die prior to completion of its respective period of time.

6. The method of claim 1, wherein outputting the expected peak current magnitude from the die comprises selectively transitioning a logic level of a signal line shared by each die of the plurality of dies.

7. The method of claim 2, wherein outputting the expected peak current magnitude of the particular die comprises broadcasting the expected peak current magnitude of the particular die to each remaining die of the plurality of dies.

8. The method of claim 1, wherein outputting the expected peak current magnitude from the die prior to completion of the period of time comprises outputting the expected peak current magnitude from the die prior to a beginning of the period of time.

9. A method of operating a plurality of dies, comprising:
   for each value of N from $N_{init}$ to D in a sequence, wherein N, $N_{init}$ and D are integers, and wherein ($D-N_{init}+1$) equals a number of dies of the plurality of dies:
     determining whether the Nth die is expected to make a transition during a corresponding period of time, wherein the transition of the Nth die is selected from a group consisting of initiating a next phase of an operation being performed by the Nth die and initiating a first phase of a next operation to be performed by the Nth die;
     determining an expected peak current magnitude of the Nth die for its corresponding period of time after determining whether the Nth die is expected to make the transition of the Nth die during its corresponding period of time; and
     broadcasting the expected peak current magnitude from the Nth die prior to completion of its corresponding period of time.

10. The method of claim 9, wherein broadcasting the expected peak current magnitude from the Nth die begins before proceeding to a next value of N.

11. The method of claim 10, wherein broadcasting the expected peak current magnitude from the Nth die completes before proceeding to a next value of N.

12. The method of claim 9, wherein the corresponding period of time for each die of the plurality of dies have a same duration.

13. The method of claim 12, wherein the duration is greater than or equal to a time to proceed in sequence through each value of N from $N_{init}$ through D and back to $N_{init}$.

14. The method of claim 9, wherein broadcasting the expected peak current magnitude from the Nth die comprises selectively transitioning a logic level of a signal line commonly connected to each die of the plurality of dies.

15. The method of claim 14, wherein selectively transitioning the logic level of the signal line comprises selectively transitioning the logic level of the signal line to represent a particular encoded value of a plurality of encoded values, and wherein each encoded value of the plurality of encoded values represents a different magnitude of expected peak current.

16. The method of claim 9, when the Nth die is expected to make the transition to the next phase of the operation being performed by the Nth die during its corresponding period of time, determining the expected peak current magnitude of the Nth die for its corresponding period of time comprises selecting a greater value of an expected peak current magnitude of the next phase of the operation being performed by the Nth die, and a present expected peak current magnitude of the Nth die.

17. The method of claim 16, wherein the expected peak current magnitude of the next phase of the operation being performed by the Nth die is selected from a group consisting of an expected peak current magnitude of the next phase of the operation being performed by the Nth die in a normal operating mode, and an expected peak current magnitude of the next phase of the operation being performed by the Nth die in a different operating mode.

18. The method of claim 9, wherein determining whether the Nth die is expected to make the transition to the next phase of the operation being performed by the Nth die during its corresponding period of time comprises deeming that the Nth die is expected to make the transition to the next phase of the operation being performed by the Nth die during its corresponding period of time when a present phase of the operation being performed by the Nth die lacks a defined duration.

19. A memory, comprising:
an array of memory cells; and
a controller for access of the array of memory cells, wherein the controller is configured to cause the memory to:
determine whether the memory is expected to make a transition during a period of time, wherein the transition is selected from a group consisting of initiating a next phase of an operation being performed by the memory and initiating a first phase of a next operation to be performed by the memory;
determine an expected peak current magnitude of the memory for the period of time after determining whether the memory is expected to make the transition during the period of time; and
output the expected peak current magnitude from the memory prior to completion of the period of time.

20. The memory of claim 19, wherein the controller being configured to cause the memory to output the expected peak current magnitude from the memory comprises the controller being configured to cause the memory to selectively transition a logic level of a signal line connected to the memory.

21. The memory of claim 19, wherein the controller being configured to cause the memory to output the expected peak current magnitude of the memory comprises the controller being configured to cause the memory to broadcast the expected peak current magnitude of the memory to a plurality of other memories commonly connected to the memory.

22. The memory of claim 19, wherein the controller being configured to cause the memory to output the expected peak current magnitude from the memory prior to completion of the period of time comprises the controller being configured to cause the memory to output the expected peak current magnitude from the memory prior to a beginning of the period of time.

23. An apparatus, comprising:
a signal line; and
a plurality of memories, wherein each memory of the plurality of memories is connected to the signal line;
wherein, for each memory of the plurality of memories, that memory comprises:
a respective array of memory cells; and
a respective controller for access of its respective array of memory cells, wherein its respective controller is configured to cause that memory to:
determine whether that memory is expected to make a transition during a respective period of time of a plurality of periods of time, wherein the transition of that memory is selected from a group consisting of initiating a next phase of an operation being performed by that memory and initiating a first phase of a next operation to be performed by that memory;
determine an expected peak current magnitude of that memory for its respective period of time after determining whether that memory is expected to make the transition of that memory during its respective period of time; and
output the expected peak current magnitude of that memory from that memory to the signal line prior to completion of its respective period of time.

24. The apparatus of claim 23, wherein each period of time of the plurality of periods of time overlaps with at least one other period of time of the plurality of periods of time.

25. The apparatus of claim 23, wherein, in a sequence of the plurality of periods of time, a particular period of time of the sequence ends after a next subsequent period of time of the sequence begins.

26. The apparatus of claim 23, wherein the respective period of time for one memory of the plurality of memories has a same duration as the respective period of time for each remaining memory of the plurality of memories.

27. The apparatus of claim 23, wherein, for each memory of the plurality of memories, the respective controller of that memory being configured to cause that memory to output the expected peak current magnitude of that memory comprises the respective controller of that memory being configured to cause that memory to output the expected peak current magnitude of that memory as a corresponding encoded value of a plurality of encoded values on the signal line.

28. The apparatus of claim 23, wherein the determined expected peak current magnitude for a particular memory of the plurality of memories is different than an actual peak current magnitude for the particular memory during its respective period of time.

29. The apparatus of claim 23, wherein, for each memory of the plurality of memories, the respective controller of that memory is further configured to cause that memory to store the expected peak current magnitude for each memory of the plurality of memories.

30. The apparatus of claim 23, wherein, for each memory of the plurality of memories, the respective controller of that memory being configured to cause that memory to determine the expected peak current magnitude of that memory comprises the respective controller of that memory being configured to cause that memory to determine an expected peak current magnitude of that memory in more than one operating mode of that memory.

* * * * *